United States Patent
Fredericksen et al.

(10) Patent No.: US 7,536,782 B1
(45) Date of Patent: May 26, 2009

(54) METHOD OF USING BONDING PAD AS A GASKET FOR ELECTRONIC SUBASSEMBLIES

(75) Inventors: Ross Thomas Fredericksen, Mantorville, MN (US); Don Alan Gilliland, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/167,289

(22) Filed: Jul. 3, 2008

Related U.S. Application Data

(63) Continuation of application No. 12/032,874, filed on Feb. 18, 2008.

(51) Int. Cl.
*H01R 43/20* (2006.01)
(52) U.S. Cl. .............................. 29/876; 29/882; 29/884; 174/382
(58) Field of Classification Search ................ 29/592.1, 29/594, 609, 832–834, 876, 881–882, 884; 174/351, 382, 383; 361/800, 801, 797, 719; 439/447, 465
See application file for complete search history.

(56) References Cited

U.S. PATENT DOCUMENTS

| | | | | |
|---|---|---|---|---|
| 5,969,783 | A * | 10/1999 | Takiar et al. | 349/150 |
| 6,235,520 | B1 * | 5/2001 | Malin et al. | 435/287.1 |
| 6,468,098 | B1 * | 10/2002 | Eldridge | 439/197 |
| 6,485,690 | B1 * | 11/2002 | Pfost et al. | 422/102 |
| 6,721,029 | B2 * | 4/2004 | Nishimura | 349/149 |
| 6,818,822 | B1 | 11/2004 | Gilliland et al. | |
| 7,096,580 | B2 * | 8/2006 | Gonzalez et al. | 29/832 |
| 7,195,503 | B2 * | 3/2007 | Eldridge | 439/197 |
| 7,238,893 | B2 | 7/2007 | Hensley et al. | |
| 7,445,490 | B2 * | 11/2008 | Jacobson | 439/465 |

* cited by examiner

*Primary Examiner*—Minh Trinh
(74) *Attorney, Agent, or Firm*—Cahn & Samuels, LLP

(57) ABSTRACT

A method for installing a bonding pad as a gasket for an electronic subassembly includes providing a bonding pad comprising an expandable foam; an air-tight bladder covering at least one side of the expandable foam; a layer of conductive material covering the air-tight bladder and comprising at least one contact point; and an open port; removing air from the air-tight bladder, thereby compressing the expandable foam; installing the bonding pad into a gap between two surfaces; allowing the compressed foam to expand under atmospheric pressure; and electrically bonding the two surfaces with the bonding pad.

1 Claim, 5 Drawing Sheets

METHOD OF USING BONDING PAD AS A GASKET FOR ELECTRONIC SUBASSEMBLIES

This application is a continuation application of U.S. Ser. No. 12/032,874 filed on Feb. 18, 2008, the entirety of which is incorporated herein by reference.

I. FIELD OF THE INVENTION

This invention relates to a method of using a bonding pad as a gasket for electronic subassemblies.

II. BACKGROUND OF THE INVENTION

It is difficult to provide increased force for a gasket material to electrically bond two parallel surfaces together. At higher frequencies, bonding over a point or a line risks having a bonded part resonate at a frequency based on its length. There is a lower probability that bonded parts will resonate due to the fact that speeds are increasing within electronic equipment, as bonded parts move the resonant points from the mid frequency region. The resonant points of and between smaller bonded structures are moved higher and higher in frequency, while at the same time increasing the size of a radiating structure at lower frequencies.

III. SUMMARY OF THE INVENTION

This invention provides a method for installing a bonding pad as a gasket for an electronic subassembly includes providing a bonding pad comprising an expandable foam; an air-tight bladder covering at least one side of the expandable foam; a layer of conductive material covering the air-tight bladder and comprising at least one contact point; and an open port. Air is removed from the air-tight bladder, thereby compressing the expandable foam. The bonding pad is installed into a gap between two surfaces. The compressed foam is allowed to expand under atmospheric pressure. The two surfaces are electrically bonded together with the bonding pad.

In the detailed description, references to "one embodiment", "an embodiment", or "in embodiments" mean that the feature being referred to is included in at least one embodiment of the invention. Moreover, separate references to "one embodiment", "an embodiment", or "in embodiments" do not necessarily refer to the same embodiment; however, neither are such embodiments mutually exclusive, unless so stated, and except as will be readily apparent to those skilled in the art. Thus, the invention can include any variety of combinations and/or integrations of the embodiments described herein.

Given the following enabling description of the drawings, the method should become evident to a person of ordinary skill in the art.

IV. BRIEF DESCRIPTION OF THE DRAWINGS

V. DETAILED DESCRIPTION OF THE DRAWINGS

FIGS. 1-5 illustrate a bonding pad for use as a gasket for bonding electronic subassemblies. The bonding pad may be used as a gasket to electronically connect two parallel surfaces, for example, as a Z-axis connection in a rack drawer.

Figure 1:
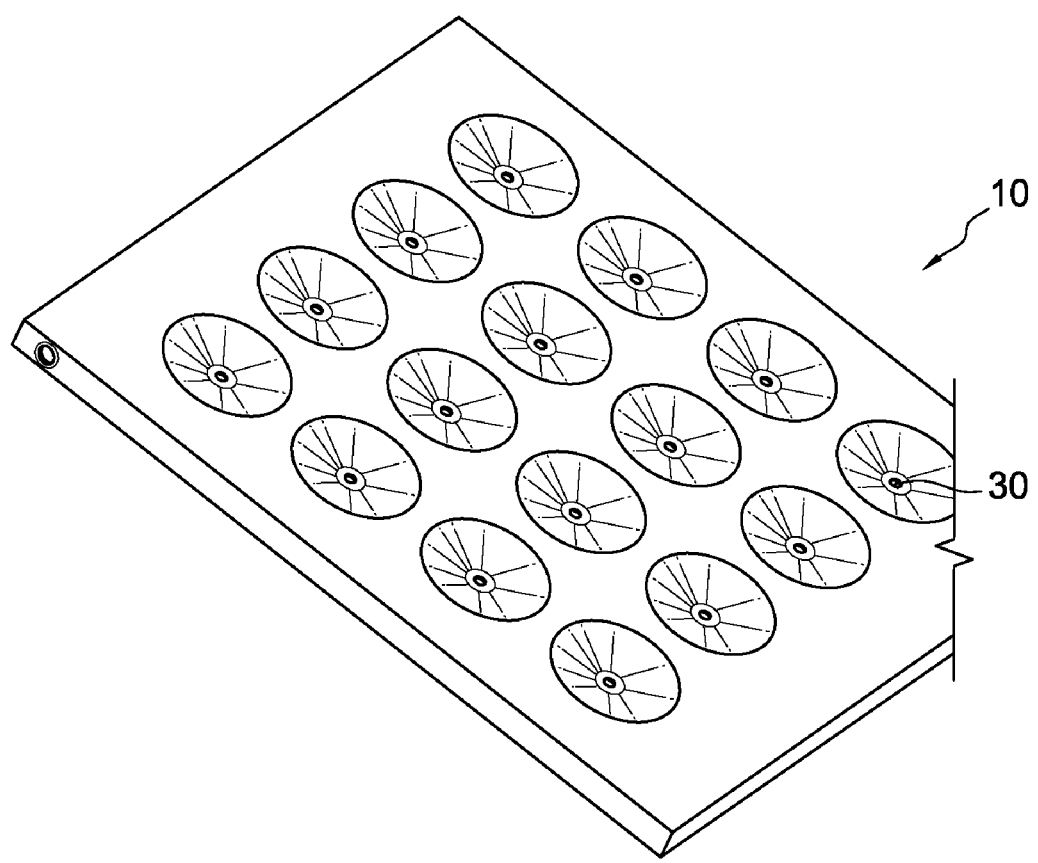
FIG. 1 illustrates a perspective view of a bonding pad for use as a gasket for bonding electronic subassemblies according to the present invention.
Figure 2:
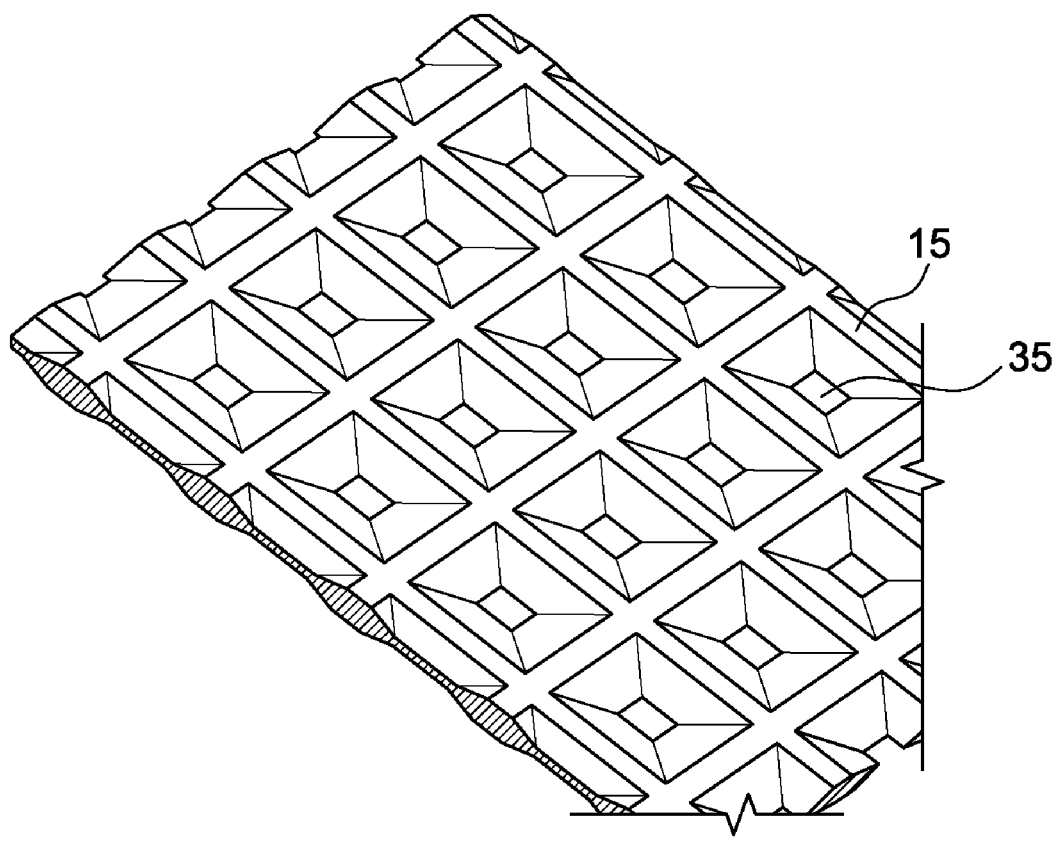
FIG. 2 illustrates an expandable foam pad of the bonding pad of FIG. 1.
Figure 4:
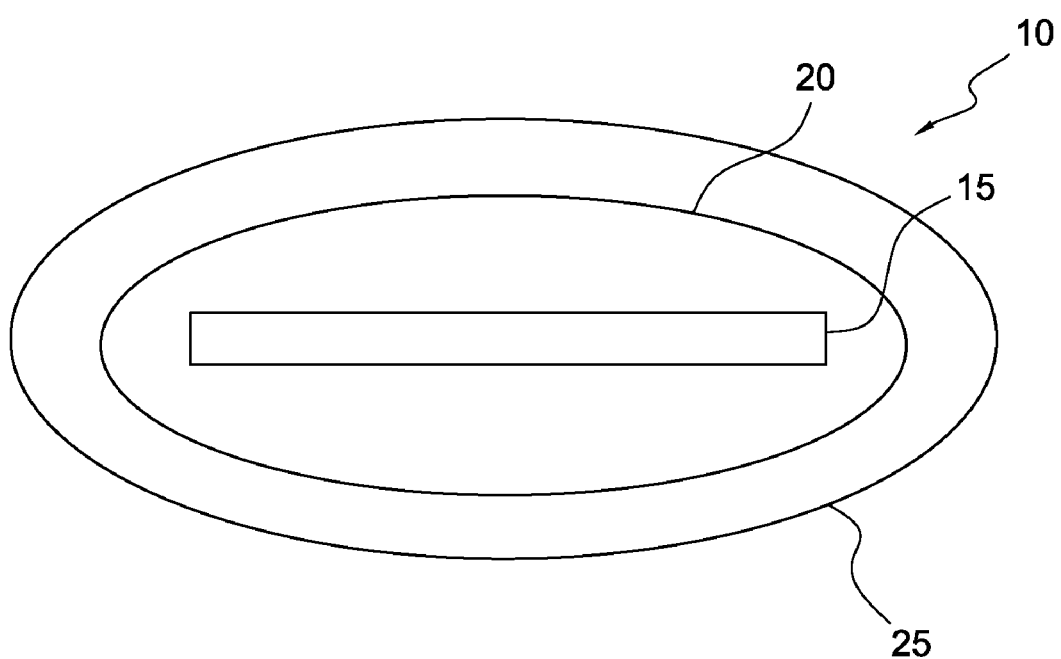
FIG. 4 is a schematic cross-section of the bonding pad of FIG. 1.

FIG. 1 and FIG. 4 illustrate a bonding pad 10 according to the present invention. The bonding pad comprises an expandable foam pad 15 (FIG. 2 and FIG. 4). In embodiments, the expandable foam pad may include, but is not limited to, an open cell foam, a closed cell foam, or combination thereof. As discussed below, the expandable foam provides the force of the bonding pad for contact between surfaces.

As illustrated in FIG. 4, the bonding pad 10 also comprises an air tight bladder 20. The air tight bladder may be made of any appropriate material. In embodiments, the air tight bladder may be made of rubber. The air tight bladder is placed on at least one side of the expandable foam. In certain embodiments, the air tight bladder may cover both sides of the expandable foam as illustrated in FIG. 4.

The bonding pad 10 also comprises a conductive material 25 that covers the air tight bladder and the expandable foam, as illustrated in FIG. 4. In embodiments, the conductive material includes, but is not limited to, a conductive fabric such as a microfilament fabric coated with a metal (e.g., Ni) or a metal alloy. The conductive material covers bonds one surface to another surface when the bonding pad is used as a gasket.

Figure 3:
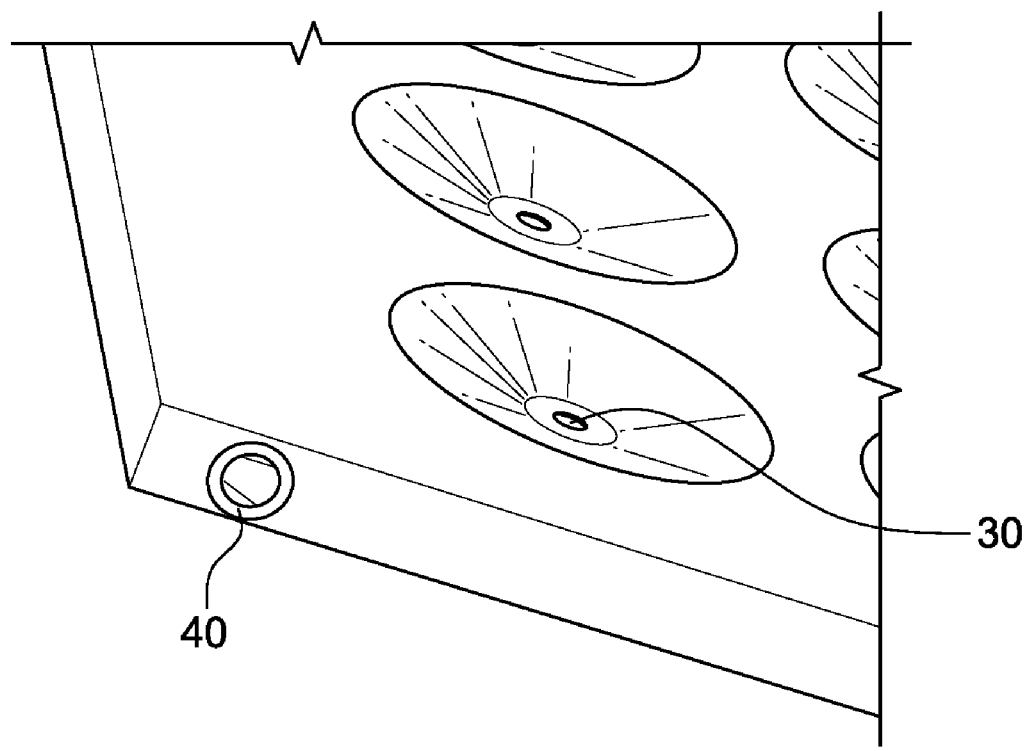
FIG. 3 is a side view of the bonding pad of FIG. 1 showing a port.

As shown in FIG. 1 and FIG. 3, the conductive material 25 comprises at least one contact point 30. The at least one contact can be of any configuration. In embodiments, the at least one contact point may have a half moon shape as illustrated. Preferably, the conductive material comprises a plurality of contact points arranged in an array. The contact points may provide low impedance connections between two surfaces in an electronic subassembly. The contact points may be used for mounting and/or electrical pass through from one surface to another surface in an electronic subassembly. As illustrated in FIG. 2, the expandable foam 15 has holes or cutouts 35 and is sealed around the at least one contact point 30 in the conductive material 25. The air tight bladder also has holes or cutouts that seal around the at least one contact point.

The bonding pad comprises a port 40 (FIG. 3) for evacuation of the air within the air tight bladder for fitting between two surfaces, for example parallel surfaces, in an electronic subassembly.

Figure 5:
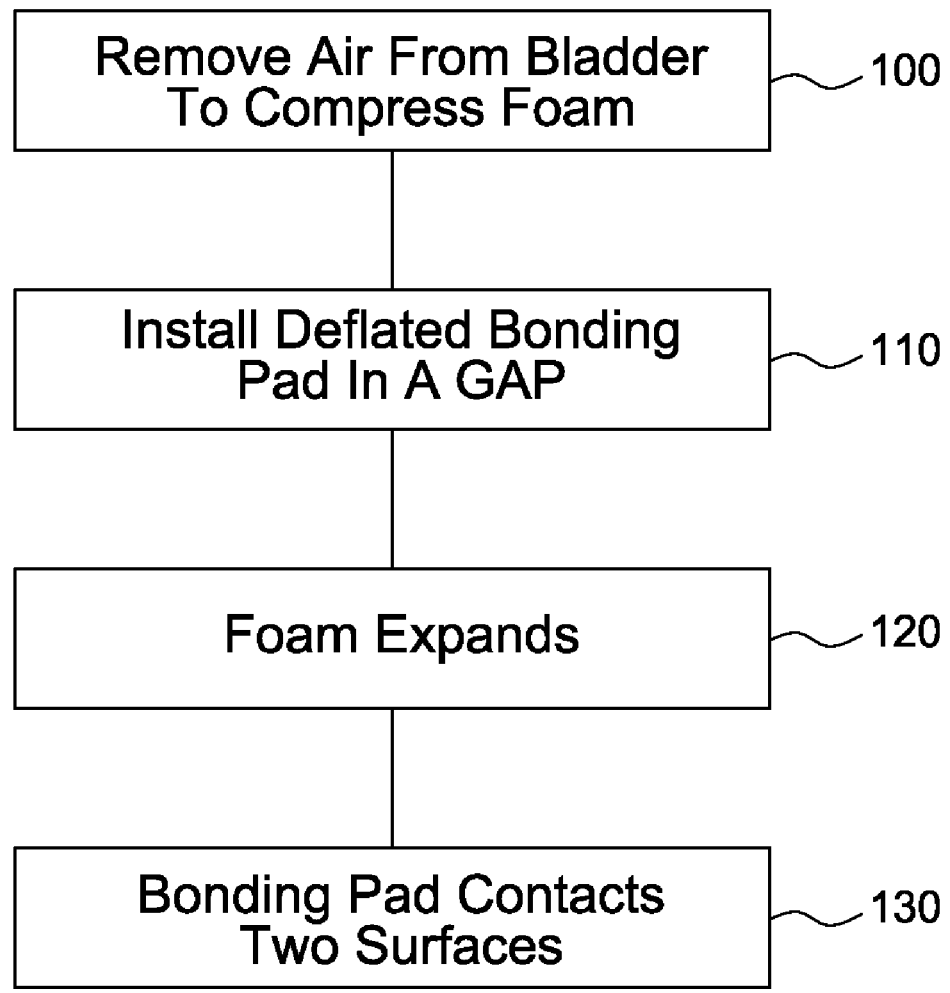
FIG. 5 is a flowchart illustrating a method of using the bonding pad according to the present invention.

FIG. 5 illustrates a method according to the present invention. To use the bonding pad, air is removed from within the air tight bladder to decrease the force for installation of the pad between two surfaces, 100. In embodiments, the air may be removed via a vacuum pump attached to port 40. As a result, the expandable foam is compressed.

The deflated bonding pad/gasket is installed in a gap, 110. Once the bonding pad is installed, the air tight bladder is not mechanically inflated to increase the force between the two surfaces. Instead, the expandable foam provides the force for the gasket, which expands under atmospheric pressure, 120. The bonding pad does not depend on any positive pressure (i.e., inflation) to meet the force requirements of contacting the two surfaces. Thus, a seal is not required. In fact, port 40 may be left open, as atmospheric pressure will cause the compressed foam to expand and provide the increased force necessary to acts as a gasket between the surfaces, 130.

In embodiments, multiple bonding pads may be used to achieve an appropriate gasket, for example, multiple bonding pads in series and/or stacked.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution. Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Computer program code for carrying out operations of the present invention may be written in a variety of computer programming languages. The program code may be executed entirely on at least one computing device, as a stand-alone software package, or it may be executed partly on one computing device and partly on a remote computer. In the latter scenario, the remote computer may be connected directly to the one computing device via a LAN or a WAN (for example, Intranet), or the connection may be made indirectly through an external computer (for example, through the Internet, a secure network, a sneaker net, or some combination of these).

It will be understood that each block of the flowchart illustrations and block diagrams and combinations of those blocks can be implemented by computer program instructions and/or means. These computer program instructions may be provided to a processor of at least one general purpose computer, special purpose computer(s), or other programmable data processing apparatus to produce a machine, such that the instructions, which execute via the processor of the computer or other programmable data processing apparatus, create means for implementing the functions specified in the flowcharts or block diagrams.

The exemplary and alternative embodiments described above may be combined in a variety of ways with each other. Furthermore, the steps and number of the various steps illustrated in the figures may be adjusted from that shown.

Although the present invention has been described in terms of particular exemplary and alternative embodiments, it is not limited to those embodiments. Alternative embodiments, examples, and modifications which would still be encompassed by the invention may be made by those skilled in the art, particularly in light of the foregoing teachings.

The invention claimed is:

1. A method for installing a bonding pad as a gasket for an electronic subassembly, comprising:
   providing a bonding pad, said bonding pad including:
      an expandable foam including an open cell foam;
      an air-tight bladder covering both sides of the expandable foam;
      a layer of conductive material covering the air-tight bladder and having a plurality of contact points; and
      an open port,
      wherein the expandable foam and the air-tight bladder have holes that are sealed around the plurality of contact points;
   removing air from the air-tight bladder via a vacuum pump attached to the port, thereby compressing the expandable foam and deflating the bonding pad;
   installing the deflated bonding pad into a gap between two surfaces of the electronic subassembly;
   allowing the compressed foam to expand under atmospheric pressure by leaving the port open; and
   electrically bonding the two surfaces of the electronic subassembly with the bonding pad via the plurality of contact points.

* * * * *